US011276548B2

(12) United States Patent
Sakai et al.

(10) Patent No.: US 11,276,548 B2
(45) Date of Patent: Mar. 15, 2022

(54) CHARGED PARTICLE BEAM DEVICE AND CHARGED PARTICLE BEAM ADJUSTMENT METHOD

(71) Applicant: Hitachi High-Tech Corporation, Tokyo (JP)

(72) Inventors: Hitomi Sakai, Tokyo (JP); Daisuke Sato, Tokyo (JP); Keiichiro Hitomi, Tokyo (JP); Hiroyuki Saito, Tokyo (JP); Kazuma Tanii, Tokyo (JP)

(73) Assignee: Hitachi High-Tech Corporation, Tokyo (JP)

(*) Notice: Subject to any disclaimer, the term of this patent is extended or adjusted under 35 U.S.C. 154(b) by 0 days.

(21) Appl. No.: 17/101,118

(22) Filed: Nov. 23, 2020

(65) Prior Publication Data
US 2021/0233735 A1 Jul. 29, 2021

(30) Foreign Application Priority Data

Jan. 23, 2020 (JP) .............................. JP2020-008869

(51) Int. Cl.
*H01J 37/147* (2006.01)
*H01J 37/10* (2006.01)
(Continued)

(52) U.S. Cl.
CPC .......... *H01J 37/1474* (2013.01); *H01J 37/10* (2013.01); *H01J 37/222* (2013.01); *H01J 37/265* (2013.01);
(Continued)

(58) Field of Classification Search
CPC .......... H01J 37/00; H01J 37/02; H01J 37/063; H01J 37/12; H01J 37/1477; H01J 37/1472;
(Continued)

(56) References Cited

U.S. PATENT DOCUMENTS 5,945,683 A 8/1999 Ohkawa et al.
2005/0236570 A1* 10/2005 Morokuma ........... H01J 37/153
250/311

(Continued)

FOREIGN PATENT DOCUMENTS

JP 10-199468 A 7/1998
JP 2017-76523 A 4/2017

*Primary Examiner* — Jason L McCormack
(74) *Attorney, Agent, or Firm* — Crowell & Moring LLP

(57) ABSTRACT

Provided are a charged particle beam device and a charged particle beam adjustment method capable of observing or inspecting a change in observation conditions in a more appropriate beam state while preventing an increase in a time required for each measurement point. The charged particle beam device includes a condenser lens 3 and an objective lens 14 configured to focus an electron beam 4 emitted from an electron source 2, a primary beam scanning deflector 5 or a secondary electron deflector 15, an adjusting element 13 configured to adjust an axis of the electron beam 4, and a control device 9 configured to supply a signal representing a control amount to the adjusting element 13 for control. The control device 9 is configured to determine the control amount by using a change amount of an intensity of the condenser lens 3, the objective lens 14, the primary beam scanning deflector 5, or the secondary electron deflector 15, and a calculation formula or a table showing a relation between the change amount of the intensity and the control amount.

13 Claims, 5 Drawing Sheets

(51) Int. Cl.
  *H01J 37/26* (2006.01)
  *H01J 37/22* (2006.01)
  *H01J 37/28* (2006.01)

(52) U.S. Cl.
  CPC ....... *H01J 37/28* (2013.01); *H01J 2237/2817* (2013.01)

(58) Field of Classification Search
  CPC .......... H01J 37/21; H01J 37/26; H01J 37/261; H01J 37/1474; H01J 37/222; H01J 37/265; H01J 37/28; H01J 37/10; H01J 2237/2817
  USPC .............................. 250/306, 307, 311, 396 R
  See application file for complete search history.

(56) References Cited

U.S. PATENT DOCUMENTS

2016/0217969 A1\* 7/2016 Mizuhara ............ H01J 37/1471
2017/0110285 A1 4/2017 Fukuda et al.

\* cited by examiner

[FIG. 1]
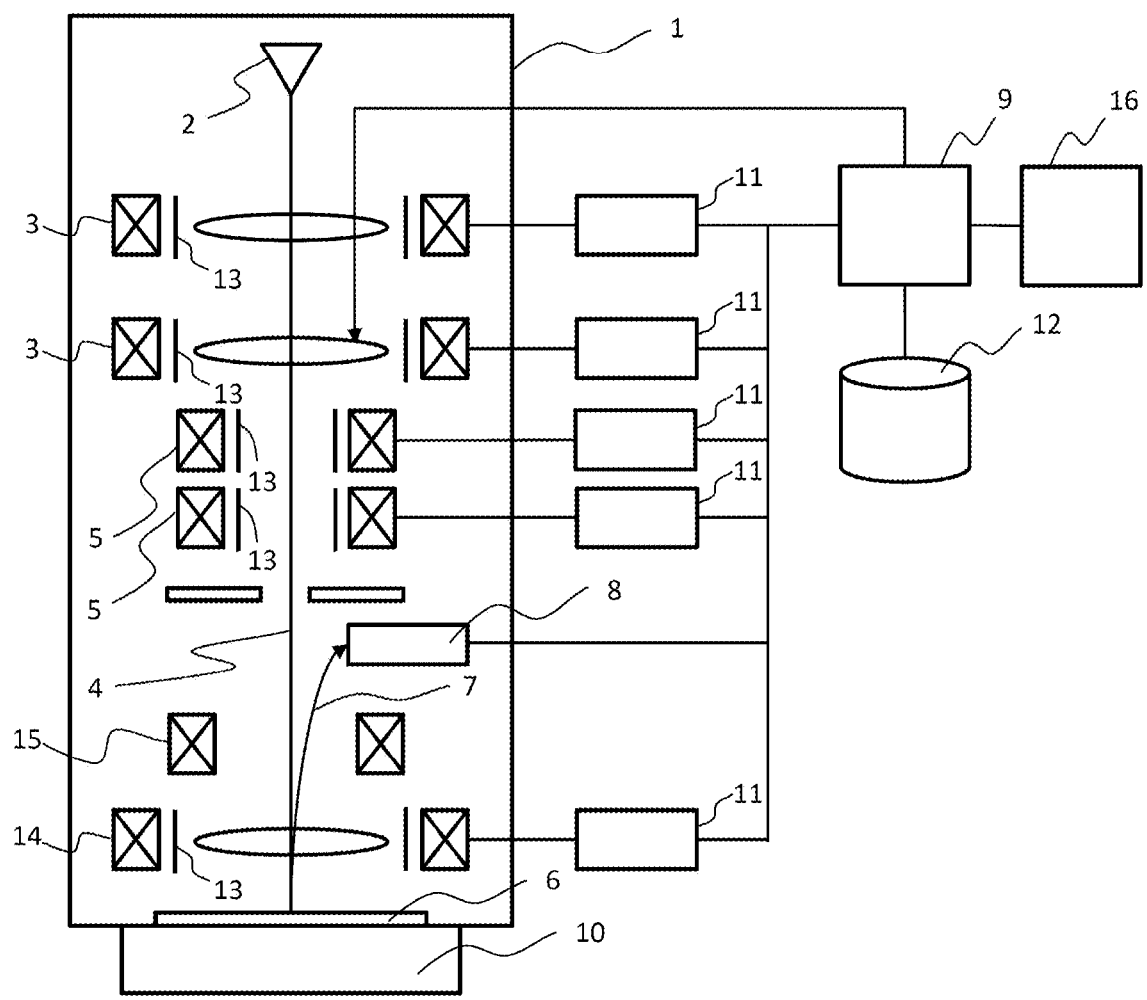

[FIG. 2]

(a) $$\Delta AL = a \cdot \Delta A \cdot \left[1 - \exp\left(-\frac{t}{\tau}\right)\right]$$

$\cdots$(FORMULA 1)

(b) $$\begin{aligned}\Delta AL_{all} = \ &a \cdot \Delta A \cdot \left[1 - \exp\left(-\frac{t}{\tau_A}\right)\right] \\ &+ b \cdot \Delta B \cdot \left[1 - \exp\left(-\frac{t}{\tau_B}\right)\right] \\ &+ c \cdot \Delta C \cdot \left[1 - \exp\left(-\frac{t}{\tau_C}\right)\right]\end{aligned}$$

$\cdots$(FORMULA 2)

[FIG. 3]
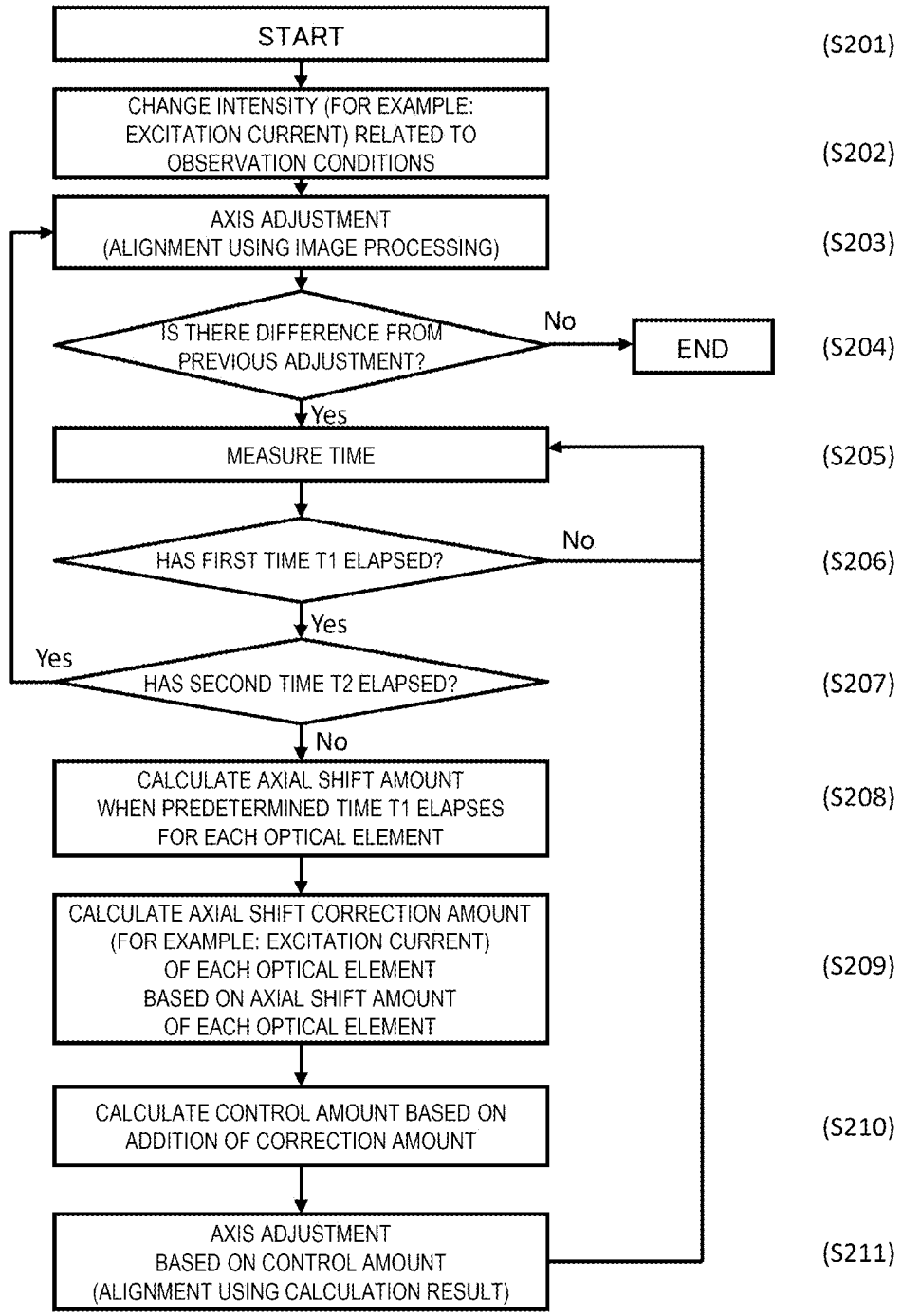

[FIG. 4]
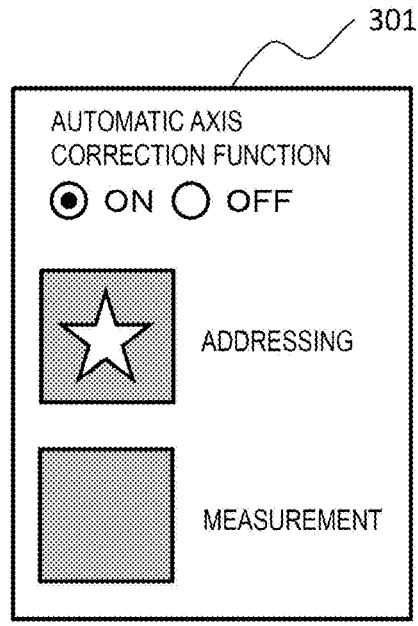
[FIG. 5]
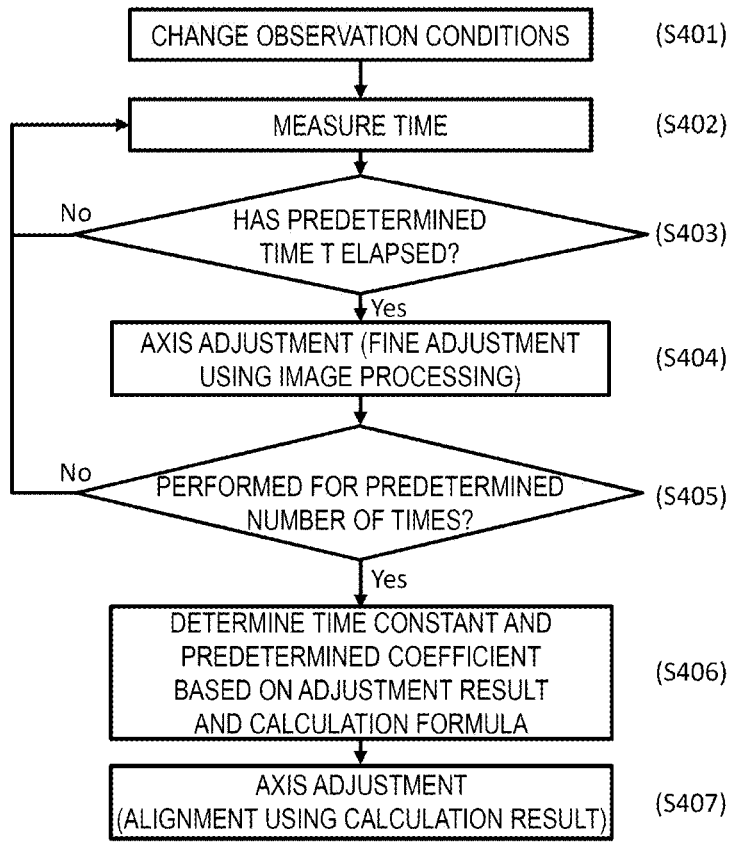

[FIG. 6]
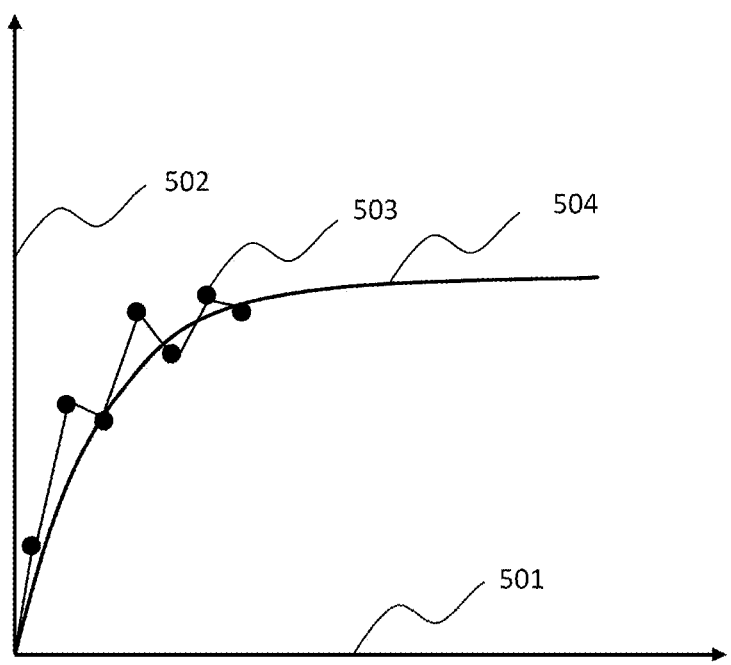

CHARGED PARTICLE BEAM DEVICE AND CHARGED PARTICLE BEAM ADJUSTMENT METHOD

TECHNICAL FIELD

The present invention relates to a charged particle beam device and a charged particle beam adjustment method. The charged particle beam device is used to, using a charged particle beam, observe and inspect a circuit pattern of a semiconductor device, for example.

BACKGROUND ART

In order for a charged particle beam device to perform high-precision measurement, it may be necessary to stabilize an optical axis of a beam and always make the beam, for example, incident vertically on a sample. Therefore, a measurement and inspection device such as CD-SEM or DR-SEM is provided with an automatic axis adjustment function, which periodically performs axis adjustment to stabilize the optical axis.

As a technique for adjusting the optical axis of the beam, those described in PTLs 1 and 2 are known.

Paragraph [0040] of PTL 1 discloses that "adjustment can be made at a proper timing by determining whether it is necessary to perform automatic adjustment by using a discrepancy degree between the automatic adjustment time and the current time, or objective lens temperature information (a discrepancy degree from the equilibrium temperature, information about the difference between the temperature of the objective lens during the previous adjustment and the current objective lens temperature, or the like) which is obtained based on the optical condition (an excitation current) of an optical element such as an objective lens and the elapsed time".

Paragraph [0021] of Patent Literature 2 describes a method of "adjusting an alignment optical system with a predicted deflection amount and a predicted excitation current by performing a step of reading, from a memory that stores a deflection amount and an excitation current when the alignment optical system is adjusted every certain time after the heating element for heating the electron source starts to generate heat from the state of not generating heat, the deflection amount and the excitation current for each time before the certain time to a latest time, a step of obtaining an approximate function by carrying out least-squares approximation based on the read deflection amount and the read excitation current, and a step of obtaining a predicted deflection amount and a predicted excitation current by substituting the latest deflection amount and excitation current into the approximate function".

CITATION LIST

Patent Literature

PTL 1: JP-A-2017-076523
PTL 2: JP-A-H10-199468

SUMMARY OF INVENTION

Technical Problem

As a result of detailed analysis of accuracy deterioration factors in order to meet growing needs for high-precision measurement in recent years, it is found that when the excitation current is changed, a thermal equilibrium state of the lens is disrupted and the lens is thermally deformed, and as a result, an optical axis of an electron beam is gradually shifted. When the optical axis shifts, an incident angle of the electron beam with respect to a measurement sample changes, and a measurement value fluctuates accordingly.

PTL 1 discloses that a thermal deformation state of a lens is predicted based on a change amount of the excitation current, and axis adjustment is performed at a proper time interval. However, in a CD-SEM or DR-SEM that uses a large number of lenses, an optimum time interval for the axis adjustment may not be the same for all lenses.

PTL 2 discloses a mechanism that predicts and automatically corrects an axial shift amount due to a thermal fluctuation when a temperature of a thermal-electron source is changed. In the CD-SEM, even when the temperature of the thermal-electron source is sufficiently stable, an axis shift may occur due to a change in observation conditions.

In addition, excessively frequent axis adjustments lead to a delay in a move-acquire-measure (MAM) time.

The invention has been made to solve such problems, and an object thereof is to provide a charged particle beam device and a charged particle beam adjustment method capable of observing or inspecting a change in observation conditions in a more appropriate beam state while preventing an increase in a time required for each measurement point.

Solution to Problem

An example of a charged particle beam device according to the invention is a charged particle beam device including:
a lens configured to focus a charged particle beam emitted from a charged particle source;
a deflector configured to deflect the charged particle beam or to deflect a charged particle obtained by irradiating a sample with the charged particle beam;
an axis adjuster configured to adjust an axis of the charged particle beam; and
a computer system configured to supply a signal representing a control amount to the axis adjuster for control, in which
the computer system is configured to determine the control amount by using a change amount of an intensity in at least one of the lens and the deflector, and a calculation formula or a table showing a relation between the change amount of the intensity and the control amount.

An example of a charged particle beam adjustment method according to the invention is a charged particle beam adjustment method by a charged particle beam device, the device including
a lens configured to focus a charged particle beam emitted from a charged particle source,
a deflector configured to deflect the charged particle beam or to deflect a charged particle obtained by irradiating a sample with the charged particle beam,
an axis adjuster configured to adjust an axis of the charged particle beam, and
a computer system configured to supply a signal representing a control amount to the axis adjuster for control,
the method including:
determining, by the computer system, the control amount by using a change amount of an intensity in at least one of the lens and the deflector, and a calculation formula or a table showing a relation between the change amount of the intensity and the control amount.

Advantageous Effect

According to the charged particle beam device and the charged particle beam adjustment method according to the invention, an observation or inspection can be performed under a change in observation conditions in a more appropriate beam state while preventing an increase in a time required for each measurement point.

BRIEF DESCRIPTION OF DRAWINGS

FIG. 1 is a schematic diagram showing a basic configuration of a charged particle beam device according to a first embodiment of the invention.

FIG. 2 is a diagram showing examples of a calculation formula.

FIG. 3 is a flowchart showing automatic correction processing when observation conditions are changed in the first embodiment.

FIG. 4 is a diagram showing a setting example on an editing screen of a measurement recipe according to the first embodiment.

FIG. 5 is a flowchart showing processing of determining a correction amount based on a result of axis adjustment using an image in a second embodiment of the invention.

FIG. 6 is a diagram showing a displacement of the correction amount of an adjusting element by the axis adjustment using the image in the second embodiment.

DESCRIPTION OF EMBODIMENTS

Examples of a charged particle beam device according to the invention include a critical dimension-scanning electron microscope (CD-SEM) used for dimension measurement of a semiconductor device and a defect review-scanning electron microscope (DR-SEM) used for defect inspection of a semiconductor device.

In these charged particle beam devices, a plurality of electron lenses are used to control orbits of primary electrons and secondary electrons according to observation conditions. For example, when a fine pattern is observed, a crossover position of a primary electron beam is controlled such that high resolution can be obtained, and when a high material contrast is desired, the orbits of the secondary electrons are controlled such that detection efficiency of backscattered electrons is high.

There are two types of electronic lenses: an electrostatic lens that controls an electron orbit using an electric field; and a magnetic field lens that controls an electron orbit using a magnetic field. In order to easily deal with the above change in the observation conditions, the magnetic field lens often utilizes a magnetic field generated by passing a current through a coil. The observation conditions can be changed by controlling the current (an excitation current) flowing through the coil.

In order for the CD-SEM or the DR-SEM to perform high-precision measurement, it is useful to stabilize an optical axis of an electron beam and always make the electron beam, for example, incident vertically on a sample. Therefore, a measurement and inspection device such as CD-SEM or DR-SEM is provided with an automatic axis adjustment function, which can perform axis adjustment to stabilize the optical axis.

Embodiments of the invention will be described below with reference to the drawings.

First Embodiment

FIG. 1 is a schematic diagram showing a basic configuration of a charged particle beam device according to a first embodiment of the invention, for example, a configuration of a CD-SEM. In the first embodiment, a charged particle is an electron, but another charged particle may be used as a modification.

An electron gun is mounted on a column 1 of the CD-SEM. An inside of the column 1 is in a vacuum state. Electrons are emitted from an electron source 2 (a charged particle source) in the electron gun. The emitted electrons pass through a vacuum, and are focused by a condenser lens 3 into a thin electron beam 4 (a charged particle beam) in the process of passing. The condenser lens 3 is a lens that focuses the electron beam emitted from the electron source 2, and is configured as, for example, an optical element.

A primary beam scanning deflector 5 (a deflector) deflects the focused electron beam 4. As a modification, the electron beam 4 may be focused after being deflected by the primary beam scanning deflector. An objective lens 14 irradiates a sample (a wafer 6 in the present embodiment) with the deflected electron beam 4. Like the condenser lens 3, the objective lens 14 is a lens that focuses the electron beam emitted from the electron source 2, and is configured as, for example, an optical element.

The focusing and deflection of the electron beam 4 causes the sample (the wafer 6 in the present embodiment) to be scanned. Charged particles such as backscattered electrons or secondary electrons are emitted based on irradiation of the electron beam 4 on the wafer 6. The sample is placed on a stage 10.

A secondary electron deflector 15 (a deflector) deflects the charged particles (such as backscattered electrons 7 or the secondary electrons) thus obtained, and a detector 8 detects this deflection. The detector 8 outputs a detection signal according to a detection result. The detection signal becomes an image signal in synchronization with a scanning signal of the primary beam scanning deflector 5.

A control device 9 (a computer system) includes a calculation unit and a storage unit. The calculation unit includes, for example, a processor, and the storage unit includes, for example, a semiconductor memory and/or a magnetic disk. The storage unit may be disposed, for example, in a storage unit 12 described later. In addition, an input/output device 16 is connected to the control device 9. The input/output device 16 includes, for example, an input device such as a keyboard and a mouse, and an output device such as a display device and a printer.

The control device 9 controls an operation of the charged particle beam device. For example, the control device 9 communicates with the column 1 and the like to grasp a state of the charged particle beam device. The state of the charged particle beam device includes, for example, conditions under which the current observation is performed (observation conditions), and coordinates of the stage 10.

The observation conditions include an intensity of focusing in the condenser lens 3 and the objective lens 14, and an intensity of deflection in the primary beam scanning deflector 5. When the condenser lens 3, the objective lens 14, and the primary beam scanning deflector 5 each include a coil, the intensities thereof are represented by a magnitude of each excitation current. That is, the observation conditions include the magnitudes of the excitation currents of the condenser lens 3, the objective lens 14, and the primary beam scanning deflector 5.

The condenser lens 3, the objective lens 14, and the primary beam scanning deflector 5 may each include a plurality of coils. For example, the condenser lens 3 alone may include a coil for controlling in an X direction and a coil for controlling in a Y direction. In this case, the observation conditions may include a magnitude of an excitation current in the X direction and a magnitude of an excitation current in the Y direction for the condenser lens 3.

A user of the charged particle beam device may change the observation conditions according to a shape of a pattern formed on the wafer 6. When the observation conditions are changed, the control device 9 changes the magnitudes of the excitation currents of the condenser lens 3, the objective lens 14, and the primary beam scanning deflector 5 so as to correspond to new observation conditions.

Due to this change in the excitation current, a temperature fluctuation occurs. For example, for the condenser lens 3, due to a change in the excitation current of the condenser lens 3, a temperature fluctuation in the condenser lens 3 occurs. Due to this temperature fluctuation, a thermal equilibrium state of the condenser lens 3 is disrupted, and a minute thermal deformation occurs in the condenser lens 3. Under an influence of this thermal deformation, an orbit of the electron beam 4 fluctuates over time, resulting in a deterioration of resolution and a fluctuation of an incident angle of the electron beam. Such an influence due to the temperature fluctuation also occurs on the objective lens 14 and the primary beam scanning deflector 5.

The control device 9 can acquire change amounts of the excitation currents of the condenser lens 3, the objective lens 14, and the primary beam scanning deflector 5. For this purpose, for example, the control device 9 includes a monitoring unit 11 that monitors the change amount of the excitation current for each of the condenser lens 3, the objective lens 14, and the primary beam scanning deflector 5.

The condenser lens 3, the objective lens 14, and the primary beam scanning deflector 5 are each provided with an adjusting element 13. The control device 9 sets the condenser lens 3, the objective lens 14, and the primary beam scanning deflector 5 as control targets, supplies a signal representing a control amount to the adjusting element 13 related to each control target, and performs control. Each adjusting element 13 is an axis adjuster that adjusts an axis of the electron beam 4 in each control target, and is also called an alignment deflector.

An axis adjustment of the electron beam 4 by the adjusting elements 13 is realized, for example, as an adjustment of a direction of the axis. The adjusting element 13 includes, for example, a coil, and the control amount is represented by a magnitude of an excitation current. The adjusting element 13 may include a coil for adjusting in the X direction and a coil for adjusting in the Y direction. The control amount of the adjusting element 13 is also called an alignment deflection amount.

The control device 9 includes the storage unit 12. The storage unit 12 stores, for each of the condenser lens 3, the objective lens 14, and the primary beam scanning deflector 5 which are the control targets, a relation between the change amount of the excitation current and the excitation current of the adjusting element 13 related to each control target.

This relation is defined in a form of, for example, a calculation formula or a table. When the calculation formula is used, the change amount of the excitation current of each control target can be used as a variable to obtain a function representing the excitation current of the adjusting element 13 related to each control target. In addition, when the table is used, a table in which the value of the excitation current of the adjusting element 13 related to each control target is associated with the value of the change amount of the excitation current of each control target can be obtained.

This relation is determined such that an influence of the excitation current of the adjusting element 13 related to the control target reduces or cancels the influence of the temperature fluctuation due to the change in the excitation current of the control target. The specific content of the relation can be appropriately determined by those skilled in the art, for example, an axial shift amount of the electron beam 4 can be obtained in advance using various observation conditions, and an appropriate magnitude of the excitation current of each adjusting element 13 corresponding to the axial shift amount can be determined in advance.

The control device 9 determines the excitation current of each adjusting element 13 by using the change amount of the excitation current of each of the condenser lens 3, the objective lens 14, and the primary beam scanning deflector 5, and the calculation formula or the table showing the relation between the change amount of the excitation current and the excitation current of each adjusting element 13. For example, the control device 9 first acquires the change amount of the excitation current of each of the condenser lens 3, the objective lens 14, and the primary beam scanning deflector 5 via each monitoring unit 11. Then, based on the acquired change amount of the excitation current, the excitation current of each adjusting element 13 is determined with reference to the relation described above between the change amount of the excitation current and the excitation current of each adjusting element 13.

FIG. 2 shows examples of the calculation formula. FIG. 2(a) shows a calculation formula when the condenser lens 3, the objective lens 14, or the primary beam scanning deflector 5 alone is set as a control target:

$$\Delta AL = a \cdot \Delta A \cdot [1 - \exp(-t/\tau)] \quad \text{(Formula 1)}.$$

In the formula, $\Delta AL$ represents the excitation current of the adjusting element 13 related to the control target, a represents a constant, $\Delta A$ represents the change amount of the excitation current of the control target, t represents an elapsed time since $\Delta A$ is acquired, and $\tau$ represents a time constant related to a change in the excitation current of the control target. It should be noted that exp represents an exponential function with e as a base, i.e., a natural logarithm, that is, $\exp(-t/\tau) = e^{(-t/\tau)}$.

In the first embodiment, the control device 9 determines the excitation current of the adjusting element 13 by using this calculation formula, whereby the axis of the electron beam 4 is adjusted. The axis adjustment can be performed accurately by using such a calculation formula.

The constant a can be appropriately designed by those skilled in the art, and can be determined, for example, by a prior experiment. For example, a relation between the change amount of the excitation current of each control target and the axial shift amount of the electron beam 4 can be measured in advance, and the constant a can be calculated based on the relation.

By calculating in advance the constant a for each control target, there is an advantage that even in the case of changing a certain control target (for example, the condenser lens 3), it is only necessary to change the constant a of the control target to be changed, and it is not necessary to change the constant a of the control target not to be changed (for example, the objective lens 14).

When, for example, the change amount of the excitation current acquired by the monitoring unit 11 is used as ΔA, an axis correction can be performed accurately. However, the monitoring units 11 may be omitted, and a determination may be made based on other values that can be acquired more directly by the control device 9 (for example, a command value representing the excitation current of each control target when the observation conditions are changed).

Since the time constant τ is included in the calculation formula, an appropriate excitation current value can be determined according to a speed of a temperature change in each control target.

When the observation conditions are changed, the excitation currents of a plurality of control targets (the condenser lens 3, etc.) existing in the column 1 may be changed, and in such a case, the axis correction is performed based on the calculation formula shown in FIG. 2(*a*) for each control target.

In the first embodiment, the adjusting element 13 is provided for each control target, but when a total of a plurality of lenses (the condenser lens 3 and the objective lens 14) and deflectors (the primary beam scanning deflector 5) are provided as in the first embodiment, a common adjusting element 13 may be provided for the plurality of control targets, as a modification.

For example, a single adjusting element 13 common to three control targets including a certain condenser lens 3, a certain objective lens 14, and a certain primary beam scanning deflector 5 may be provided. In such a case, the control device 9 may determine an individual control amount for each control target, and determine a control amount of the common adjusting element 13 by summing the individual control amounts.

The excitation current of this common adjusting element 13 is given by, for example, a calculation formula shown in FIG. 2(*b*). That is, $$\Delta AL_{all} = a \cdot \Delta A \cdot [1 - \exp(-t/\tau_A)]$$

$$+ b \cdot \Delta B \cdot [1 - \exp(-t/\tau_B)]$$

$$+ c \cdot \Delta C \cdot [1 - \exp(-t/\tau_C)] \qquad \text{(Formula 2)}.$$

Formula 2 is a formula when there are three control targets, in which $\Delta AL_{all}$ represents a total value of the excitation currents of the adjusting element 13 related to all the control targets, a, b, and c each represent a constant, ΔA, ΔB, and ΔC each represent the change amount of the excitation current of the control target, t represents an elapsed time since ΔA, ΔB, and ΔC are acquired, and $\tau_A$, $\tau_B$, and $\tau_C$ each represent a time constant related to a change in the excitation current of the control target.

By using such a calculation formula, the axis can be appropriately adjusted even when the common adjusting element 13 is provided for the plurality of control targets.

In this case, by calculating in advance the constants a, b, and c for respective control targets, there is also an advantage that even in the case of changing a certain control target (for example, the condenser lens 3), it is only necessary to change a constant (for example, the constant a) for the control target to be changed, and it is not necessary to change the constant (for example, the constant b) of the control target not to be changed (for example, the objective lens 14).

In Formula 1 and Formula 2, a threshold value related to the elapsed time t may be defined, and the adjusting element 13 may be controlled according to this threshold value. In the first embodiment, a first time $T_1$ and a second time $T_2$ are used, and a control for the adjusting element 13 is changed according to a relation between the first time $T_1$ and the second time $T_2$ and the elapsed time t.

For example, $T_1$ represents a time interval for changing the excitation current of the adjusting element 13 in the first embodiment, and each $T_1$ elapses, the excitation current of the adjusting element 13 is changed according to Formula 1 or Formula 2 to correct the axis. That is, the control device 9 determines the excitation current of the adjusting element 13 for each $T_1$ by using the change amount of the excitation current of each control target and the calculation formula (Formula 1 or Formula 2) or the table. At this time, it is not necessary to perform an axis correction based on an image in the related art, and an influence on a MAM time is avoided.

$T_2$ is a time longer than $T_1$, and each $T_2$ elapses, the control device 9 performs an axis adjustment for the electron beam 4 by using an image (including a pattern represented as an image). That is, the control device 9 determines the excitation current of the adjusting element 13 by using an image for each $T_2$.

Specific processing of this axis adjustment can be appropriately designed by those skilled in the art, and can be performed, for example, by using a well-known technique. As a specific example, the charged particle beam device acquires an image of the sample or the like, calculates a shift between a reference axis position and an actual axis position by using this image, and changes the excitation current of the adjusting element 13 according to the calculated shift to correct the axis. The axis correction using the image takes a processing time longer than that of the axis correction by using Formula 1 or 2, but may correct the axis more accurately than the axis correction by using Formula 1 or 2.

As described above, the excitation current of the adjusting element 13 is determined for each $T_1$ and $T_2$, but at this time, when a change in the excitation current of the adjusting element 13 is small, subsequent processing of changing the excitation current of the adjusting element 13 may be omitted until the observation conditions are changed next time. In this way, excessively frequent axis corrections can be omitted.

Specifically, the control device 9 calculates a difference from the previously determined excitation current each time the excitation current of the adjusting element 13 is newly determined. When this difference meets a predetermined condition (for example, when the difference is 0, or when the difference is within a predetermined allowable range), the subsequent processing of changing the excitation current of the adjusting element 13 is omitted until the observation conditions are changed next time. That is, when a difference between the latest excitation current and the immediately preceding excitation current is within a predetermined range, the control device 9 does not perform the determination of the excitation current of the adjusting element 13 for each $T_1$ and the determination of the excitation current of the adjusting element 13 for each $T_2$ until the excitation current of at least one control target (the condenser lens 3 or the like) changes. In such a case, it is considered that the control target has reached the thermal equilibrium state, and even when the subsequent processing of changing the excitation current of the adjusting element 13 is omitted, a large axial shift does not occur.

$T_2$ may be a value different for control targets. When control targets having different $T_2$s coexist, $T_2$ of a control target having a longest $T_2$ may be used in common for all control targets. In this case, the correction using the image is performed only once for the charged particle beam device for each $T_2$.

FIG. 3 is a flowchart showing automatic correction processing when the observation conditions are changed in the first embodiment. In the processing of FIG. 3, the charged particle beam device first reads a measurement recipe (a program that defines the operation of the charged particle beam device), loads the sample (the wafer 6), and sets a state in which the electron beam is set as START (step S201). The measurement recipe includes information representing an accelerating voltage of the electron beam, an excitation current when the accelerating voltage is set, and the like, depending on a measurement target.

When a shape of a wafer to be observed is changed, the user may change the observation conditions in order to change beam conditions (step S202). The change in the observation conditions is, for example, a change in the excitation current. In this case, the control device 9 performs the axis adjustment using the image (step S203). A time point when step S203 is executed (for example, a time point when the axis adjustment using the image is performed) is recorded.

After that, a determination is made based on a difference from a previous correction (step S204). When the axis adjustment is a first correction or when the difference from the previous correction is not within a predetermined range, the elapsed time t from step S203 is measured (step S205).

When the elapsed time t is equal to or longer than the first time $T_1$ (step S206) and equal to or shorter than the second time $T_2$ (step S207), an axial shift amount is calculated for each control target (the condenser lens 3, etc.) (step S208). The axial shift amount is, for example, the change amount of the excitation current.

After step S208, an axial shift correction amount (that is, the excitation current of each adjusting element 13) is calculated by using Formula 1 (step S209).

When the common adjustment element 13 is provided for the plurality of control targets, by using Formula 2, the axial shift correction amounts for the control targets are added to calculate the excitation current of the adjusting element 13 (step S210). When the adjusting element 13 is provided independently for each control target, step S210 may be omitted.

After the excitation current of each adjusting element 13 is calculated in this way, the excitation current of each adjusting element is actually changed (step S211), whereby an axis alignment is performed. In this way, an observation under an appropriate beam state is realized.

When the elapsed time t is equal to or longer than $T_2$ in step S207, the processing returns to step S203, and the axis adjustment using the image is performed again. Here, when there is no difference from the previous correction (step S204), an automatic axis correction function is terminated. In this case, it is considered that a thermal fluctuation of the control target due to the change in the observation conditions has reached the thermal equilibrium state.

In the example of FIG. 3, the determination for the difference in step S204 is performed only after step S203 (the axis adjustment using the image), but this determination may also be performed after step S211 (the axis adjustment using the calculation formula). That is, regardless of whether the elapsed time t is equal to or longer than $T_2$, it may be confirmed whether there is a difference from an axis state at the time of a previous axis adjustment, and based on the result, it may be determined whether a subsequent axis correction is necessary.

An example of processing when the observation conditions are further changed in a state where the temperature change in each control target is not sufficient and the thermal equilibrium state is not reached after the observation conditions are changed will be described below.

For example, in the CD-SEM, since the observation conditions are changed according to the wafer to be observed, the excitation current of the control target is frequently changed. Therefore, it is considered to further change the observation conditions before the thermal fluctuation caused by a previous change in the excitation current is saturated. Even in this case, it is possible to perform the axis correction by using the processing shown in the flowchart of FIG. 3.

The automatic correction function according to the first embodiment is a particularly useful function in a measurement for controlling an axis state in detail, such as an observation of a deep hole or a deep groove, but it is not necessary for all measurements. Therefore, it is preferable to provide a mechanism that can set whether to use the function for each measurement recipe.

FIG. 4 shows a setting example on an editing screen of the measurement recipe according to the first embodiment. This setting example is a display example of GUI 301 when the measurement recipe is set. This GUI 301 includes an input field for inputting whether to enable (ON) or disable (OFF) the automatic axis correction function. If the automatic axis correction function is enabled, the processing shown in FIG. 3 is executed according to the change in the observation conditions. If the automatic axis correction function is disabled, the processing shown in FIG. 3 will not be executed even when the observation conditions are changed.

In this way, by adding the input field to the GUI, it is possible to enable/disable the automatic axis correction function for each measurement recipe, and therefore, unnecessary axis correction processing can be omitted for measurement recipes that do not require the automatic axis correction function.

In the first embodiment, a method of adjusting the optical axis using the calculation formula or the table is described in order to minimize an influence on the MAM time. By combining such an adjustment method with an adjustment method using an image, which has been performed in an automatic axis adjustment in the related art, a more accurate adjustment can be realized. According to the present embodiment, in the charged particle beam device including one or more control targets (for example, the optical element such as the condenser lens 3), it is possible to perform an observation and an inspection under an appropriate beam state for each change in the observation conditions.

The first embodiment is one in which an axial shift caused by a thermal deformation of a lens due to a change in observation conditions is corrected, and has an object and problem different from that of the technique disclosed in PTL 2. In addition, in the first embodiment, since the axial shift amount when the observation conditions are changed can be acquired in advance and the calculation formula or the table can be created in advance, it is not necessary to perform such a step during the adjustment.

In the first embodiment, the monitoring unit 11 and the adjusting element 13 are provided for each of the condenser lens 3, the objective lens 14, and the primary beam scanning deflector 5. Alternatively, as a modification, a part of the monitoring units 11 and the adjusting elements 13 may be omitted. For example, the monitoring unit 11 and the adjusting element 13 may be provided only for one or more condenser lenses 3, may be provided only for one or more objective lenses 14, or may be provided only for one or more primary beam scanning deflectors 5.

In addition, in the first embodiment, the monitoring unit 11 and the adjusting element 13 are not provided for the secondary electron deflector 15. Alternatively, as a modification, the monitoring unit 11 and the adjusting element 13 may be provided for the secondary electron deflector 15. In this case, the control device 9 may also control the adjusting element 13 for the secondary electron deflector 15 based on the change amount of the excitation current, similar to the primary beam scanning deflector 5. In this case, it is possible to omit the monitoring unit 11 and the adjusting element 13 for all of the condenser lens 3, the objective lens 14, and the primary beam scanning deflector 5.

Second Embodiment

In a second embodiment, the control device 9 executes processing of determining a constant in the calculation formula in addition to the processing in the first embodiment. In particular, in the second embodiment, a correction amount based on the calculation formula or the table is determined based on a correction amount when the axis adjustment using the image is performed.

FIG. 5 is a flowchart showing the processing of determining the correction amount based on a result of the axis adjustment using the image in the second embodiment.

When the observation conditions are changed (step S401), the time point is recorded, and then an elapsed time t from this time point is measured (step S402). When the elapsed time t is equal to or longer than a predetermined time T (step S403), the axis adjustment using the image is performed (S404). When the number of times of executions of step S404 is equal to or greater than a predetermined number of times (for example, N times) (step S405), a correction amount of the calculation formula or the table is determined based on a correction amount of the axis adjustment up to that point (step S406). A correction is then performed using the calculation formula or the table that gives the determined correction amount (step S407). Step S407 roughly corresponds to steps S203 to S211 in the first embodiment (FIG. 3).

FIG. 6 is a diagram showing a displacement of the correction amount of the adjusting element due to the axis adjustment using the image in the second embodiment. A horizontal axis 501 represents an elapsed time, and a vertical axis 502 represents a correction amount. The correction amount represents ΔAL in Formula 1, and corresponds to, for example, the excitation current of the adjusting element 13.

Correction amounts 503 based on the axis adjustment using the image are plotted. For example, the determination of the correction amount 503 at each time point can be automatically performed by the control device 9, or manually performed by the user of the charged particle beam device.

The calculation formula or the table is determined based on the acquired correction amounts 503. When a calculation formula is used, for example, the constant a and the time constant τ in Formula 1 are determined. A specific determination method can be optionally designed by those skilled in the art, and for example, a least squares method can be used.

In this way, the calculation formula (for example, Formula 1) is determined. FIG. 6 illustrates a graph 504 of the determined calculation formula. After the calculation formula is determined, the axis adjustment based on the calculation formula is performed as in the first embodiment, and therefore, the influence on the MAM time is minimized.

When a table is used, the table can be created so as to associate the change amounts of the observation conditions with the acquired correction amounts 503.

An axial shift amount of each control target (for example, the optical element such as the condenser lens 3) may differ depending on a device configuration (for each control target, or for each charged particle beam device even with the same control target). Therefore, in order to determine the calculation formula or the table, it is preferable to acquire in advance the axial shift amount according to the change amount of the excitation current of each control target for each device configuration. In the second embodiment, this determination is performed based on the result of the axis adjustment using the image.

In addition, when a difference in the axial shift amount of each control target is small between the device configurations, it is also possible to set a common constant a and time constant τ based on an average value of a plurality of devices and to use the calculation formula in common. In this case, since the processing of determining the constant a and the time constant τ can be reduced, the MAM time can be shortened and an adjustment time of the device configurations can also be shortened.

The invention is not limited to the embodiments described above, and includes various modifications. For example, the embodiments described above are not necessarily limited to those having all the configurations described, and a part of the configuration of each embodiment may be deleted, or may be added or replaced with a configuration of another embodiment.

REFERENCE SIGN LIST 1 column
2 electron source (charged particle source)
3 condenser lens (lens)
4 electron beam (charged particle beam)
5 primary beam scanning deflector (deflector)
6 wafer (sample)
7 backscattered electron
8 detector
9 control device (computer system)
10 stage
11 monitoring unit
12 storage unit
13 adjusting element (axis adjuster)
14 objective lens (lens)
15 secondary electron deflector (deflector)
16 input/output device

The invention claimed is:

1. A charged particle beam device comprising:
a lens configured to focus a charged particle beam emitted from a charged particle source;
a deflector configured to deflect the charged particle beam or deflect a charged particle obtained by irradiating a sample with the charged particle beam;
an axis adjuster configured to adjust an axis of the charged particle beam; and
a computer system configured to supply a signal representing a control amount to the axis adjuster for control, wherein
the computer system is configured to determine the control amount by using a change amount of an intensity in at least one of the lens and the deflector, and a calculation formula or a table showing a relation between the change amount of the intensity and the control amount, and the calculation formula or the table includes a time constant related to a change in the intensity.

2. The charged particle beam device according to claim 1, wherein the computer system is configured to determine the control amount by using the calculation formula, and the calculation formula is:

$$\Delta AL = a \cdot \Delta A \cdot [1 - \exp(-t/\tau)],$$

in the formula, $\Delta AL$ represents the control amount, a represents a constant, $\Delta A$ represents the change amount of the intensity, t represents an elapsed time since $\Delta A$ is acquired, and $\tau$ represents the time constant.

3. The charged particle beam device according to claim 1, wherein the charged particle beam device includes a plurality of the lenses and the deflectors in total, and the computer system is configured to determine an individual control amount for each of the lenses and the deflectors, and determine the control amount by summing the individual control amounts.

4. The charged particle beam device according to claim 1, wherein the computer system is configured to:

determine the control amount every first time by using the change amount of the intensity and the calculation formula or the table, and determine the control amount by using an image every second time, which is longer than the first time.

5. The charged particle beam device according to claim 4, wherein when a difference between a latest control amount and a control amount immediately therebefore is within a predetermined range, the computer system does not perform the determination of the control amount every the first time and the determination of the control amount every the second time until an intensity of at least one of the lens and the deflector changes.

6. The charged particle beam device according to claim 1, wherein the axis adjuster is provided for each of the lens and the deflector.

7. The charged particle beam device according to claim 1, wherein the intensity and the control amount are represented by a magnitude of an excitation current.

8. The charged particle beam device according to claim 1, wherein the deflector is a deflector configured to deflect the charged particle beam.

9. The charged particle beam device according to claim 1, wherein the deflector is a deflector configured to deflect a sample charged particle obtained by irradiating the sample with the charged particle beam.

10. The charged particle beam device according to claim 1, wherein the lens is a condenser lens.

11. The charged particle beam device according to claim 1, wherein the lens is an objective lens.

12. The charged particle beam device according to claim 1, further comprising:

a monitoring unit configured to monitor a change in the intensity.

13. A charged particle beam adjustment method by a charged particle beam device, the device including a lens configured to focus a charged particle beam emitted from a charged particle source, a deflector configured to deflect the charged particle beam or to deflect a charged particle obtained by irradiating a sample with the charged particle beam, an axis adjuster configured to adjust an axis of the charged particle beam, and a computer system configured to supply a signal representing a control amount to the axis adjuster for control, the charged particle beam adjustment method comprising:

determining, by the computer system, the control amount by using a change amount of an intensity in at least one of the lens and the deflector, and a calculation formula or a table showing a relation between the change amount of the intensity and the control amount, wherein the calculation formula or the table includes a time constant related to a change in the intensity.

* * * * *